US006272646B1

(12) United States Patent
Rangasayee et al.

(10) Patent No.: US 6,272,646 B1
(45) Date of Patent: *Aug. 7, 2001

(54) PROGRAMMABLE LOGIC DEVICE HAVING AN INTEGRATED PHASE LOCK LOOP

(75) Inventors: Krishna Rangasayee, Sunnyvale; John Shannon, Morgan Hill, both of CA (US)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/707,694

(22) Filed: Sep. 4, 1996

(51) Int. Cl.[7] .................................................. G06F 1/04
(52) U.S. Cl. ................................. 713/500; 713/501
(58) Field of Search ...................... 395/556; 713/500, 713/501; 716/1, 2, 5, 6, 16

(56) References Cited

U.S. PATENT DOCUMENTS

| | | | |
|---|---|---|---|
| 4,229,699 | 10/1980 | Frissell | 328/63 |
| 4,419,629 | 12/1983 | O'Brien | 328/72 |
| 4,893,271 | * 1/1990 | Davis et al. | 395/556 |
| 4,918,641 | 4/1990 | Jigour et al. | 364/716 |
| 4,999,526 | 3/1991 | Dudley | 307/269 |
| 5,046,035 | 9/1991 | Jigour et al. | 364/716 |
| 5,341,044 | 8/1994 | Ahanin et al. | 307/465 |
| 5,386,155 | 1/1995 | Steele et al. | 326/37 |
| 5,491,814 | * 2/1996 | Yee et al. | 395/556 |
| 5,506,982 | * 4/1996 | Hotta et al. | 395/556 |
| 5,510,742 | 4/1996 | Lemaire | 327/146 |
| 5,528,509 | * 6/1996 | Sawai et al. | 395/500.02 |
| 5,544,047 | * 8/1996 | Appel | 395/500.02 |
| 5,589,782 | 12/1996 | Sharpe-Geistlr | 326/38 |
| 5,652,536 | 7/1997 | Nookala et al. | 327/298 |
| 5,670,896 | 9/1997 | Diba et al. | 326/40 |
| 5,684,434 | 11/1997 | Mann et al. | 331/16 |
| 5,710,524 | * 1/1998 | Chou et al. | 331/1 A |
| 5,740,410 | * 4/1998 | McDermott et al. | 713/501 |
| 5,748,559 | * 5/1998 | Raza et al. | 365/233 |
| 5,757,207 | * 5/1998 | Lytle et al. | 326/39 |
| 5,774,703 | * 6/1998 | Weiss et al. | 713/501 |
| 5,821,794 | * 10/1998 | Nazarian et al. | 327/298 |

OTHER PUBLICATIONS

Cypress Data Book 1996—"Programmable Logic", pp. 2–1 to 2–5, pp. 3–1, pp. 3–8 to 3–14, San Jose CA.

* cited by examiner

Primary Examiner—Dennis M. Butler
(74) Attorney, Agent, or Firm—Christopher P. Maiorana, P.C.

(57) ABSTRACT

The present invention integrates a phase lock loop (PLL) with a programmable logic device (PLD) to realize a flexible PLD with a variety of clocking options. The present invention generates multiple clock frequencies internally to a programmable logic device using a single reference clock input. The programmer can dynamically change the functionality of the programmable logic device. As a result, a "virtual hardware device" is realized. The ability to change the frequency of operation also dynamically offers a tremendous advantage to users of reconfigurable computing.

20 Claims, 3 Drawing Sheets

PROGRAMMABLE LOGIC DEVICE HAVING AN INTEGRATED PHASE LOCK LOOP

FIELD OF THE INVENTION

The present invention relates generally to programmable logic devices (PLDS) and, more particularly to programmable logic devices having an integrated phase lock loop to provide enhanced clocking capabilities and other additional features.

BACKGROUND OF THE INVENTION

Modern computers require various clocks operating at different frequencies to operate different individual components of individual on-board devices. In a programmable logic device (PLD), to realize various clock frequencies at the particular macro cells (or registers) of the device, previous approaches have traced multiple clock signals throughout the layout of the chip to supply the particular cells with the desired frequencies.

Modern semiconductor manufacturers typically specialize in specific component manufacturing processes in which they have expertise. For example, a manufacturer skilled in the fabrication of programmable logic devices may not necessarily be skilled in the manufacturing of phase locked loop (PLL) devices.

Personal Computer (PC) motherboard applications need a standard set of frequencies to operate. These frequencies are typically generated from a reference clock frequency. Since many designs use multiples of certain input frequencies, design engineers typically u se delay loops or counters on a PLD to achieve the various frequencies. Consequentially, the logic resources available in the programmable logic device are expended to implement this remedial frequency adjustment. As a result, either less programmable features may be implemented, or either more costly PLD complex programmable devices (CPLDs) must be implemented or field programmable gate arrays (FPGAs).

Another problem occurs when industry standards change. When standards change, design engineers typically must redesign their entire chips. For example, the peripheral connect interface (PCI) bus currently uses a bus speed of 33 MHz. It is anticipated that the industry standard for the PCI bus will be increased to 66 MHz in the future. The use of previous approaches (such as delay loops in the programming elements of the logic device) would require a significant amount of design work to upgrade to 66 MHz or any other new standard. By reducing setup times, a performance improvement may be realized.

SUMMARY OF THE INVENTION

The present invention integrates a phase lock loop (PLL) with a programmable logic device (PLD) to realize a flexible PLD with a variety of clocking options. The present invention generates multiple clock frequencies internally to a programmable logic device using a single reference clock input. The programmer can dynamically change the functionality of the programmable logic device. As a result, a "virtual hardware device" is realized. The ability to change the frequency of operation also dynamically offers a tremendous advantage to users of reconfigurable computing.

Objects, features and advantages of the present invention include providing a dynamically programmable multiple frequency clock generator with a programmable logic device which will create a device more efficient than either of the two devices considered separately. The present invention will provide a wide output frequency range that can be dynamically adjusted, a number of individually programmable outputs, a high degree of control of output skew, an internal loop filtering which would not require external components and a wide number of output frequencies. The present invention may be configured to feed a clock distribution network of targeted programmable logic devices and may be accessible to one or more input/output (I/O) pins. In a particular embodiment, the present invention may provide a low clock jitter (less than 200 ps), a variable duty cycle (ranging between 40% and 60%), either a 3.3 volt or 5.0 volt input supply voltage operation range, a matched output impedance and a low power consumption. The present invention may be implemented using high speed CMOS implementation.

BRIEF DESCRIPTION OF THE DRAWINGS

These and other objects, features and advantages of the present invention will be apparent from the following detailed description and the appended claims in which:

DETAILED DESCRIPTION OF THE PREFERRED EMBODIMENTS

Figure 1:
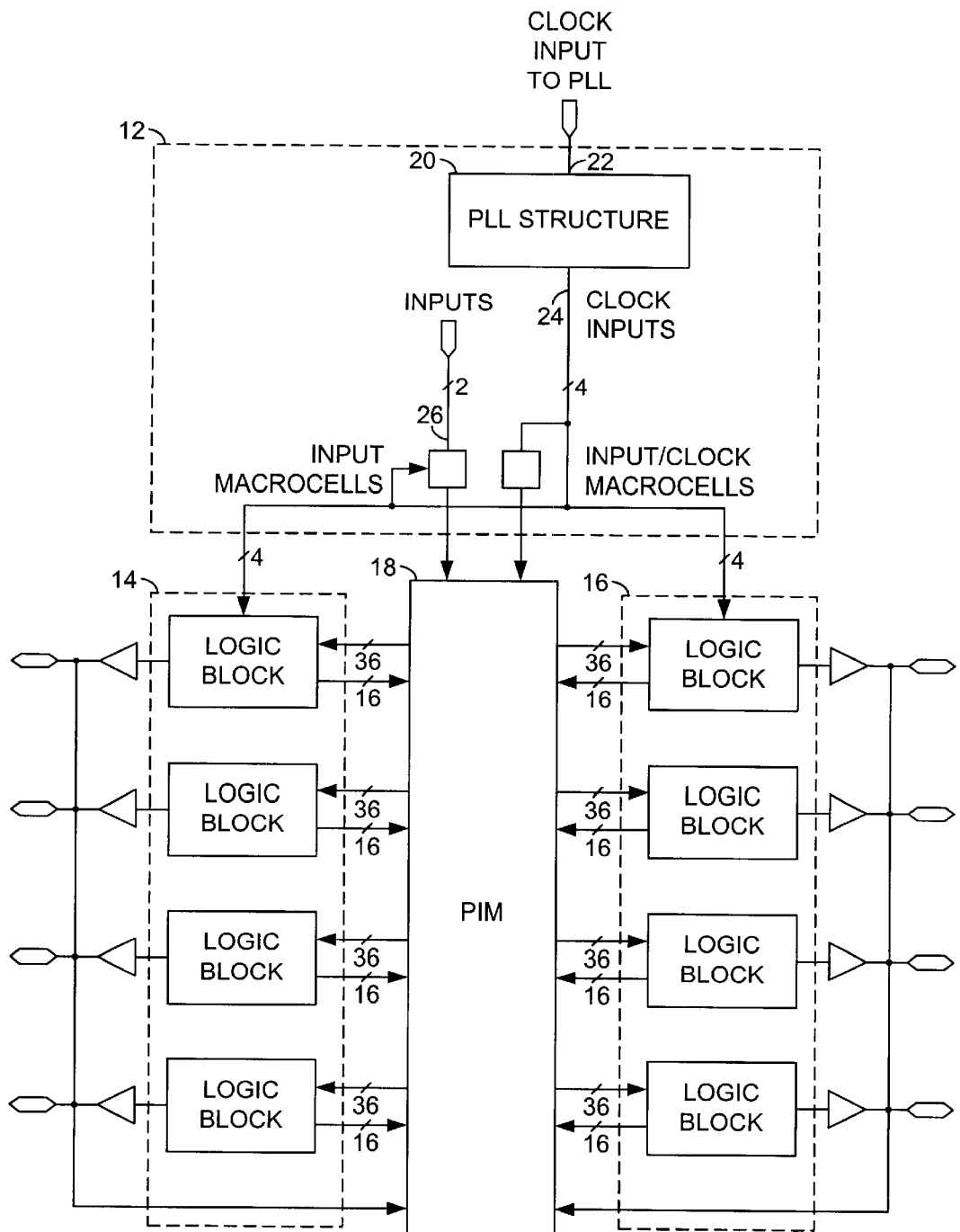
FIG. 1 is a block diagram illustrating a preferred embodiment of the present invention incorporated into a CPLD architecture.

A block diagram of a CPLD 10 incorporating a preferred embodiment of the present invention is shown. The CPLD 10 generally comprises an input section 12, a logic section 14, a logic section 16 and a Programmable Interconnect Matrix (PIM) 18. The input section generally comprises a PLL structure 20. The PLL structure 20 has an input 22 that receives a clock from an external source (not shown). The PLL structure 20 produces a number of individual clocks on a multi-bit bus 24 that is shown, for example, as being a 4-bit bus. A 4-bit bus may produce four individual clock signals that are presented to the PIM 18. A number of programming inputs are received at a multi-bit bus 26. The multi-bit bus 26 presents these inputs to the PIM 18. The multi-bit bus 24 presents the individual clock inputs to the logic section 14 and the logic section 16. A feedback of the clock inputs is also presented back to the multi-bit bus 26.

Figure 2:
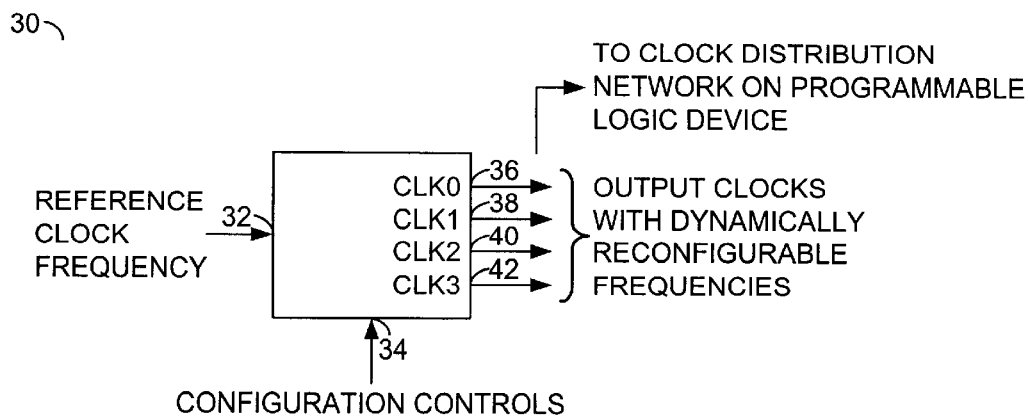
FIG. 2 is a block diagram of an individual distribution cell of a preferred embodiment of the present invention.

Referring to FIG. 2, a block diagram of a clock distribution scheme 30 in accordance with a preferred embodiment of the present invention is shown. The clock distribution scheme 30 generally comprises an input 32, an input 34, an output 36, an output 38, an output 40 and an output 42. The input 32 may receive a reference clock frequency from an external device (not shown). The input 34 may receive configuration information from a control logic (not shown). The output 36 generally presents a signal CLK0, the output 38 generally presents a signal CLK1, the output 40 generally presents a signal CLK2 and the output 42 generally presents a signal CLK3. The outputs 36, 38, 40 and 42 may be presented to a clock distribution network on a programmable logic device (not shown). Each of the outputs 36, 38, 40 and 42 may be configured to operate at an independent frequency that may drive the individual logic blocks of the programmable logic device. A detailed illustration of how to perform such an independent clock configuration may be found in U.S. patent application Ser. No. 08/549,915, which is hereby incorporated by reference in its entirety. While a particular aspect of cited reference deals with using a non-votile memory such as an EPROM to produce and configure the desired clocks, the present invention may be implemented using a wider variety of PLLs and PLDs.

Figure 3:
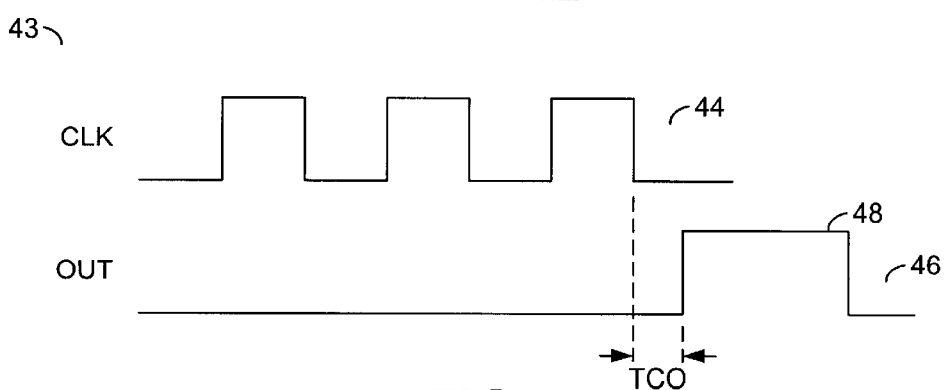
FIG. 3 is a timing diagram illustrating the falling edge triggered clock of a preferred embodiment of the present invention.

Referring to FIG. 3, a timing diagram 43 illustrating a falling edge triggered flip-flop is shown. The timing diagram 43 generally comprises a reference clock signal 44 and an output clock signal 46. The reference clock signal 44 is generally a fixed frequency clock that may be generated either internally or externally in order to fit the design criteria of a particular application. The output clock 46 has a single pulse 48 that is skewed from the individual pluses of the reference clock 44 by a fixed amount Tco.

Figure 4:
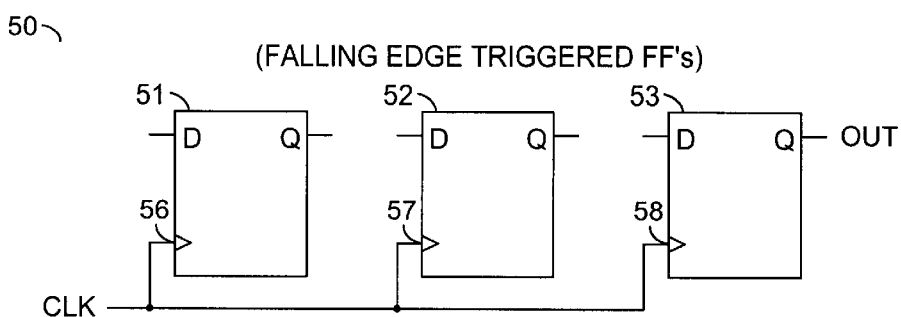
FIG. 4 is a block diagram illustrating a flip-flop scheme for implementing the falling edge triggered flip-flops.

Referring to FIG. 4, a block diagram illustrating the implementation of a falling edge triggered flip-flop scheme 50 is shown. The scheme 50 generally comprises a first flip-flop 51, a second flip-flop 52 and a third flip-flop 53. The flip-flop 51 has an input 56 that may receive a reference clock CLK. The flip-flop 52 has an input 57 that may receive the reference clock CLK. The flip-flop 53 has an input 58 that may receive the clock CLK. Each of the flip-flops 51, 52 and 53 has an input D and an output Q. The flip-flops 51, 52 and 53 are generally cascaded together. The output Q of the flip-flop 53 provides a signal OUT that corresponds to the output signal 46 of FIG. 3. The flip-flops 51, 52 and 53 are generally edge triggered devices.

Figure 5:
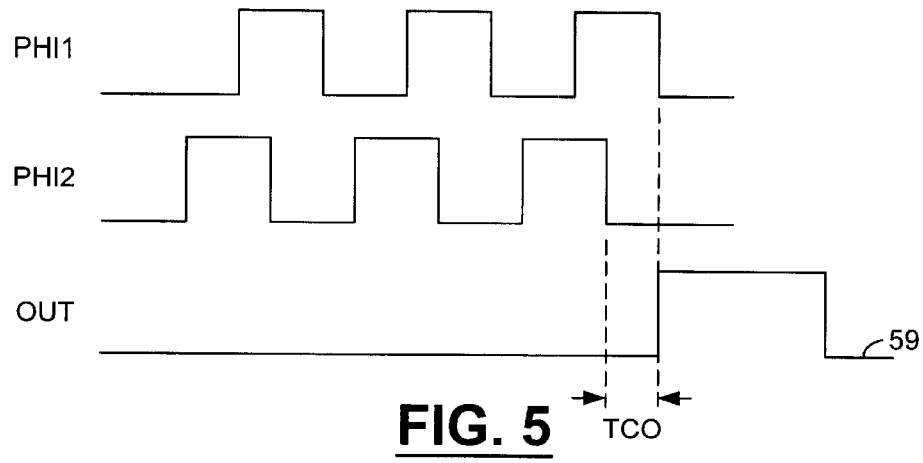
FIG. 5 is a timing diagram illustrating a relationship between a PHI1 and a PHI2 signal.

Referring to FIG. 5, a timing diagram illustrating a relationship between a signal PHI1 and a signal PHI2 is shown. The signal PHI1 is generally a fixed frequency clock. The signal PHI2 is also generally a fixed frequency clock. The signal PHI1 and PHI2 are generally out of phase by a fixed amount Tco. An output signal 59 is triggered at the end of the fixed amount Tco.

Figure 6:
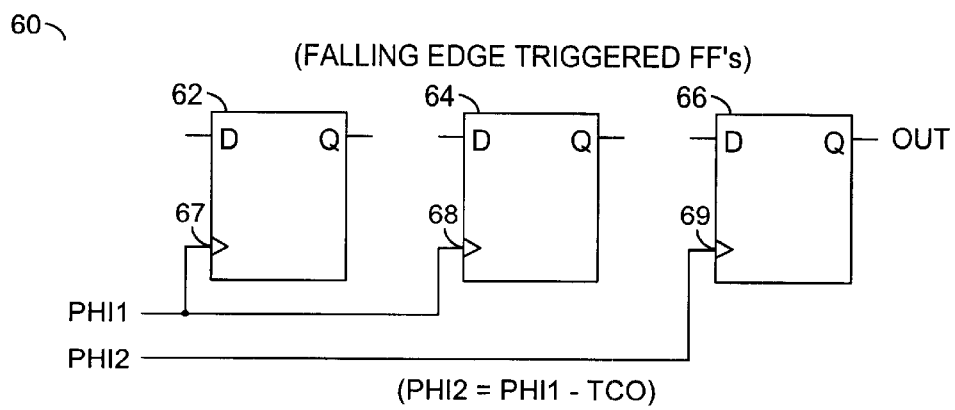
FIG. 6 is a flip-flop scheme illustrating the implementation of the PHI1 and PHI2 signals.

Referring to FIG. 6 of a flop-flop scheme 60 illustrating the implementation of the signal PHI1 and PHI2 is shown. The flip-flop scheme 60 generally comprises a flip-flop 62, a flip-flop 64 and a flip-flop 66. The flip-flop 62 has an input 67 that generally receives the signal PHI1 and the flip-flop 64 has an input 68 that generally receive the signal PHI1. Similarly, the flip-flop 66 has an input 69 that generally receive the signal PHI2. Each of the flip-flops 62, 64 and 66 have an input D and an output Q. The flip-flops 62, 64 and 66 are generally cascaded together. The output Q of the flip-flop 66 generally provides the output OUT shown in FIG. 5. The flip-flop scheme 60 allows a zero delay input and/or output buffer to be implemented. The zero delay input buffer allows set up (Ts) and hold (Th) times to be adjusted to meet high frequency design requirements. The zero delay output buffer allows adjustment of the clock to an output delay (Tco) to meet the design criteria of a particular application. As a result, programmers may run their designs at very high frequencies while eliminating the delays involved with the Tco and Ts times.

Figure 7:
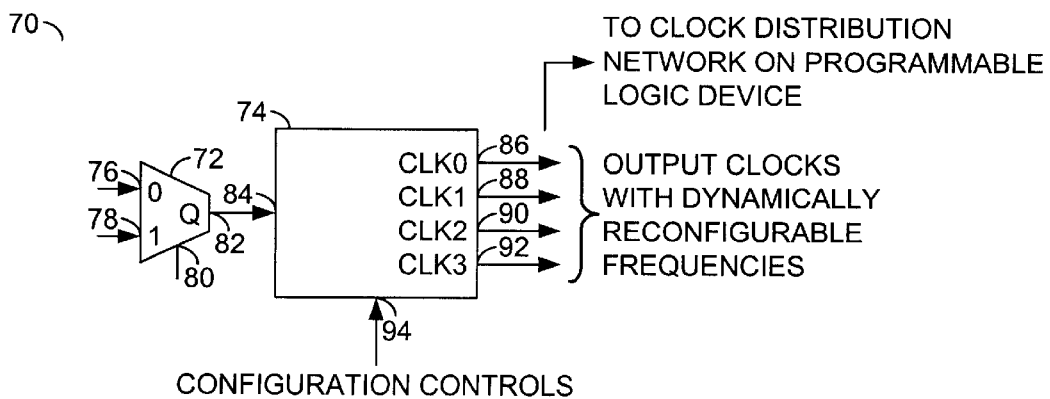
FIG. 7 is a block diagram illustrating an alternate embodiment of the present invention including a multiplexer for adding additional flexibility.

Referring to FIG. 7, a block diagram illustrating an alternate embodiment clock distribution scheme 70 of the present invention is shown. The clock distribution scheme 70 generally comprises a multiplexer 72 and a clock distribution block 74. The multiplexer 72 has a first input 76 that generally receives an internally generated clock, an input 78 that generally receives an externally generated clock and an input 80 that generally receives a configuration signal that selects between the first input 76 and the second input 78. The multiplexer 72 presents a clock signal at the output 82 that is received at an input 84 of the clock distribution block 74. The clock distribution block 74 generally comprises an output 86, an output 88, an output 90, an output 92 and a control output 94. The output 86 generally presents a signal CLK0, the output 88 generally presents a signal CLK1, the output 90 generally presents a signal CLK2 and the output 92 generally presents a signal CLK3. The outputs 86, 88, 90 and 92 may be presented to a clock distribution network on a programmable logic device (not shown). Each of the outputs 86, 88, 90 and 92 may be configured to operate an independent frequency that may drive the individual logic blocks of the programmable logic device. Each of the clock signals CLK0, CLK1, CLK2 and CLK3 are individually programmable to a plurality of frequencies. The clock distribution block 74 may provide the individually programmable frequencies at the outputs 86, 88, 90 and 92 by any of a plurality of means including, but not limited to, a phase lock loop (PLL). Each of the signals CLK0, CLK1, CLK2 and CLK3 are accessible through one or more input/output pins. Additionally, each of the outputs 86, 88, 90 and 92 may have a particular output impedance that may be adjusted to match the impedance of an external device. Since the frequencies present at the outputs 86, 88, 90 and 92 are controlled in part by the control signal received at the input 94, the frequencies may be programmed after fabrication of the clock distribution scheme 70.

The input 76 of the multiplexer 72 may receive one or more internally generated clocks. Similarly, the input 78 to the multiplexer 72 may receive one or more externally generated clocks. As a result, the multiplexer 72 may provide a plurality of reference clocks at the input 84. Since a plurality of reference clocks may be present at the input 84, the manipulation provided by the clock distribution block 74 is enhanced to provide even a greater number of frequencies at the outputs 86, 88, 90 and 92. The clock distribution scheme 70 may be implemented in a programmable logic device or a complex programmable logic device according to the design criteria of a particular application. The number of clocks present at the input 76 may be adjusted to fit the design criteria of a particular application. The number of configuration bits present at the input 94 may be adjusted to fit the design criteria of a particular application.

The present invention integrates a PLL with a PLD to realize a flexible PLD with a variety of clocking options. The present invention generates multiple clock frequencies internally to a programmable logic device using a single reference clock input. The present invention may also be implemented using a field programmable gate array (FPGA).

While the invention has been particularly shown and described with reference to preferred embodiments thereof, it will be understood by those skilled in the art that various changes in form and details may be made without departing from the spirit and scope of the invention.

What is claimed is:

1. A device comprising:
   a programmable logic circuit configured to (i) generate one or more control signals and (ii) receive one or more clock signals; and
   a phase lock loop circuit configured to generate said one or more clock signals, each capable of oscillating at a different one of a plurality of frequencies, said clock signals generated in response to (i) a reference clocks (ii) said one or more control signals, and (iii) one or more of said clock signals wherein said programmable logic circuit and said phase lock loop circuit are integrated on a single circuit.

2. The circuit according to claim 1, wherein said one or more clock signals are individually programmable to oscillate at a different one of said plurality of frequencies.

3. The circuit according to claim 1, wherein said programmable logic circuit comprises one or more logic blocks.

4. The circuit according to claim 3, wherein said logic block comprises a product term array.

5. The circuit according to claim 1, wherein said one or more clock signals each have an impedance that is adjusted to match an external impedance.

6. The circuit according to claim 1, wherein said plurality of frequencies can be programmed after fabrication and installation of said device.

7. The circuit according to claim 1, wherein said reference clock is selected from two or more reference clock signals in response to a configuration signal.

8. The circuit according to claim 7, wherein said two or more reference clock signals are generated internally to said device.

9. The circuit according to claim 7, wherein said two or more reference clock signals are generated externally to said device.

10. The device according to claim 1, wherein said programmable logic circuit comprises a device selected from a group consisting of programmable logic devices (PLDs), complex programmable logic devices (CPLDs) and field programmable gate arrays (FPGAs).

11. The device according to claim 1, wherein said programmable logic circuit is further configured to generate one or more output signals in response to (i) one or more input signals and (ii) said one or more clock signals.

12. A method for dynamically changing a frequency of operation of a programmable logic circuit comprising the steps of:
   (a) configuring said programmable logic circuit to generate one or more control signals and receive one or more clock signals; and
   (b) generating said one or more clock signals with a phase lock loop circuit, each of said one or more clock signals being:
      (i) capable of oscillating at a different one of a plurality of frequencies, and
      (ii) generated in response to a reference clock, one or more of said clock signals, and said one or more control signals.

13. The method according to claim 12, further comprising the step of:
   (c) individually programming each of said one or more clock signals to one of a plurality of independent frequencies.

14. The method according to claim 13, further comprising the step of:
   (d) adjusting an impedance of said one or more clock signals to match an external impedance.

15. The method according to claim 13, further comprising the step of:
   (c) selecting said reference clock frequency from one or more internal clock signals generated internally to said programmable logic circuit.

16. The method according to claim 12, further comprising the step of:
   (c) selecting said reference clock frequency from one or more external clock signals generated externally to said programmable logic circuit.

17. The method according to claim 13, further comprising the step of:
   (d) selecting said reference clock from one or more second clock signals generated internally or externally to said programmable logic circuit.

18. A device comprising:
   means for implementing programmable logic for manipulating information to generate one or more control signals, wherein said means for implementing programmable logic receives one or more clock signals; and
   means for generating said one or more clock signals in response to (i) a reference clock, (ii) said one or more control signals, and (iii) one or more of said clock signals wherein said one or more clock signals are each capable of oscillating at a different one of a plurality of frequencies, said means for implementing programmable logic and said means for generating are integrated on a single circuit.

19. The device according to claim 18, wherein said one or more clock signals are individually programmable to oscillate at one of said plurality of frequencies.

20. The device according to claim 19, wherein said one or more clock signals each have an impedance that is adjusted to match an impedance of an external device.

* * * * *

INTER PARTES REEXAMINATION CERTIFICATE (917th)
United States Patent
Rangasayee et al.

(10) Number: US 6,272,646 C1
(45) Certificate Issued: Jul. 28, 2014

(54) PROGRAMMABLE LOGIC DEVICE HAVING AN INTEGRATED PHASE LOCK LOOP

(75) Inventors: Krishna Rangasayee, Sunnyvale, CA (US); John Shannon, Morgan Hill, CA (US)

(73) Assignee: Intellectual Ventures II LLC, Wilmington, DE (US)

Reexamination Request:
No. 95/001,550, Feb. 18, 2011

Reexamination Certificate for:
Patent No.: 6,272,646
Issued: Aug. 7, 2001
Appl. No.: 08/707,694
Filed: Sep. 4, 1996

(51) Int. Cl.
*G06F 1/04* (2006.01)

(52) U.S. Cl.
USPC .......................................... 713/500; 713/501

(58) Field of Classification Search
USPC ........................................................ 713/500
See application file for complete search history.

(56) References Cited

To view the complete listing of prior art documents cited during the proceeding for Reexamination Control Number 95/001,550, please refer to the USPTO's public Patent Application Information Retrieval (PAIR) system under the Display References tab.

*Primary Examiner* — Mark Sager

(57) ABSTRACT

The present invention integrates a phase lock loop (PLL) with a programmable logic device (PLD) to realize a flexible PLD with a variety of clocking options. The present invention generates multiple clock frequencies internally to a programmable logic device using a single reference clock input. The programmer can dynamically change the functionality of the programmable logic device. As a result, a "virtual hardware device" is realized. The ability to change the frequency of operation also dynamically offers a tremendous advantage to users of reconfigurable computing.

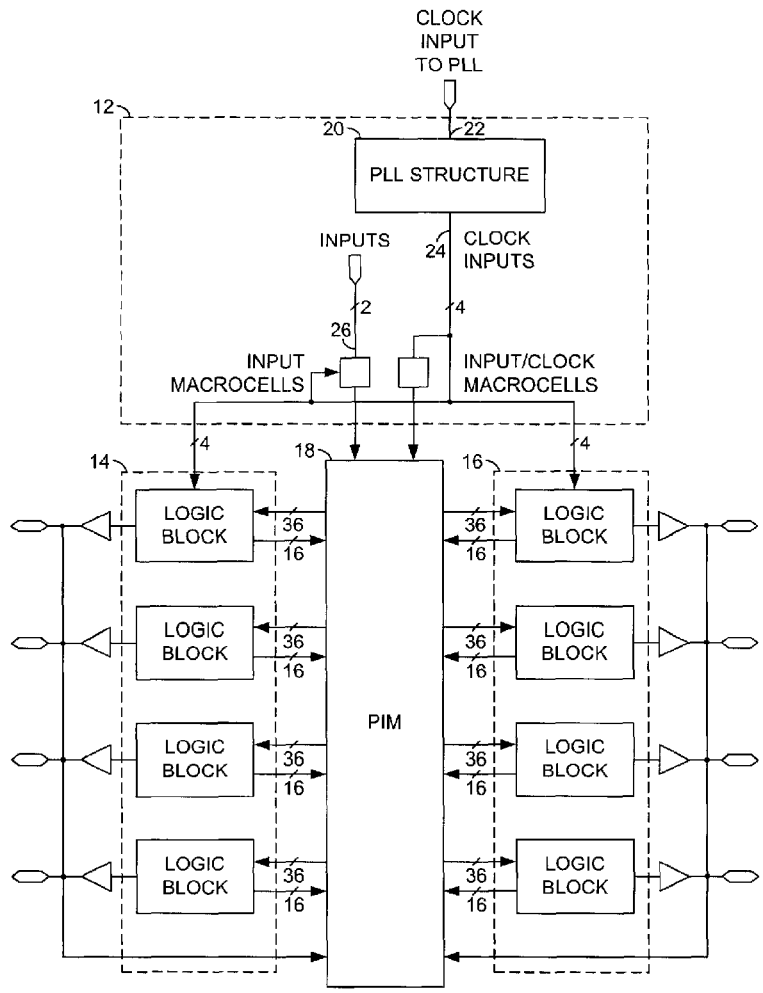

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-19 are cancelled.

Claim 20 is determined to be patentable as amended.

New claim 21 is added and determined to be patentable.

20. The device according to claim 19, wherein said [one] *two* or more clock signals each have an impedance that is adjusted to match an impedance of an external device.

21. *A device comprising:*
*a programmable logic circuit configured to (i) generate one or more control signals and (ii) receive one or more clock signals; and*
*a phase lock loop circuit configured to generate said one or more clock signals, each capable of oscillating at a different one of a plurality of frequencies, said clock signals generated in response to (i) a reference clocks (ii) said one or more control signals, and (iii) one or more of said clock signals wherein said programmable logic circuit and said phase lock loop circuit are integrated on a single circuit;*
*wherein said one or more clock signals comprises a plurality of clock signals;*
*wherein said programmable logic circuit comprises a plurality of logic blocks; and wherein said programmable logic circuit is configured to route a first clock signal to a first logic block in said plurality of logic blocks and to route a second clock signal to a second logic block in said plurality of logic blocks.*

\* \* \* \* \*